United States Patent [19]

Roman et al.

[11] Patent Number: 4,959,326
[45] Date of Patent: Sep. 25, 1990

[54] FABRICATING T-GATE MESFETS EMPLOYING DOUBLE EXPOSURE, DOUBLE DEVELOP TECHNIQUES

[75] Inventors: Bernard J. Roman, Summit, N.J.; Richard E. Muller, Pasadena, Calif.

[73] Assignee: Siemens Aktiengesellschaft, Berlin and Munich, Fed. Rep. of Germany

[21] Appl. No.: 289,071

[22] Filed: Dec. 22, 1988

[51] Int. Cl.$^5$ ............................................ H01L 21/338
[52] U.S. Cl. ................................. 437/40; 437/39; 437/175; 437/203; 437/229; 437/912; 437/944; 437/179
[58] Field of Search ................. 437/41, 40, 39, 36, 437/175, 176, 179, 203, 228, 229, 912, 944; 357/22

[56] References Cited

U.S. PATENT DOCUMENTS

| | | | |
|---|---|---|---|
| 4,213,840 | 7/1980 | Omori et al. | 437/177 |
| 4,532,005 | 7/1985 | Grieco et al. | 156/661.1 |
| 4,557,797 | 12/1985 | Fuller et al. | 156/643 |
| 4,621,042 | 11/1986 | Pampalone et al. | 437/229 |
| 4,657,629 | 4/1987 | Bigelow | 156/661.1 |
| 4,774,193 | 9/1988 | Juergens | 437/4 |

FOREIGN PATENT DOCUMENTS

| | | | |
|---|---|---|---|
| 0044553 | 1/1982 | European Pat. Off. | 437/928 |
| 59-135773 | 8/1984 | Japan | 437/36 |

OTHER PUBLICATIONS

Taylor, G. C. et al., "High-Efficiency . . . ", *IEEE Transaction on Electron Devices*, vol. ED-34, No. 6, Jun. 1987, pp. 1259-1263.
Chao, P. C. et al., "Electron-Beam Fabrication . . . ", *IEEE Transaction on Electron Devices*, vol. ED-32, No. 6, Jun. 1985, pp. 1042-1046.
Bandy, S. G. et al., "Submicron GaAs . . . ", *IEEE Electron Device Letters*, vol. EDL-4, No. 2, Feb. 1983, pp. 42-44.
Mueller, K. H. et al., "Synchrotron Lithography . . . ", *Proceedings of Microcircuit Engineering*, 1986, 8 pages.
Morimoto, H. et al., "A GaAs Metal-Semiconductor . . . ", *J. Vac. Sci. Technol. B* 5(1), Jan./Feb. 1987, pp. 211-214.
Matsumura, M. et al., "Submicrometer Lift-Off . . . ", *Electronics Letters*, Jun. 11, 1981, vol. 17, No. 12, pp. 429-430.

*Primary Examiner*—Olik Chaudhuri
*Assistant Examiner*—T. N. Quach
*Attorney, Agent, or Firm*—John F. Moran; Eugene S. Indyk

[57] ABSTRACT

A method for forming a T-gate for a MESFET device comprises a double exposure, double develop process. In a first exposure employing lithography a layer of PMMA is applied first to a substrate and spun to a desired thickness and then baked for a predetermined period. The gate pattern was aligned to the ohmic level and either E-beam written or exposed to deep UV radiation through a quartz mask. The wafer as treated was then spray developed using a mixture of MIBK and alcohol. After coating with a Novolak resist, the same gate mask was either realigned to the Ohmic level and exposed to mid-range UV radiation in the 400 nm range or alternatively E-beam written with a modified gate pattern to eliminate the T at the gate pad. The wafer was then spray developed again, this time using LSI developer. The second photo was overexposed in order to form a large opening through the top of the T while the first photo was underexposed to make the stem of the T as narrow as possible. After an oxygen plasma descum, the wafer was spray etched with a suitable solution and then rinsed. The resultant wafer possessed a T-shaped recess for the gate configuration which then was conventionally metallized to form MESFETS.

20 Claims, 5 Drawing Sheets

FABRICATING T-GATE MESFETS EMPLOYING DOUBLE EXPOSURE, DOUBLE DEVELOP TECHNIQUES

BACKGROUND OF THE INVENTION

This invention relates to methods for manufacturing and fabricating low impedance metal gates on MESFETS and more particularly to a method for a fabricating a T-gate for an MESFET employing a double exposure, double develop process.

In GaAs MESFETS small gate resistance and short gate length are essential for high gain and low noise performance. The MESFET device is well known and employs a metal semiconductor barrier as a junction. A general approach taken in the prior art for obtaining both low resistance and small length is the adoption of a key-shaped cross section gate (T-gate) structure where the small foot or stem defines the length and the wide top provides a low resistance. The resulting large surface area is essential at operating frequencies above 10 GHZ because of microwave skin effects. T-shaped metal lines have been fabricated by the prior art through the use of a high sensitivity resist on a low sensitivity resist (HI/LO) double layer electronic beam (E-beam) resist system.

Many such techniques have been investigated in the prior art. As indicated by the prior art, the gate consists of a large trapezoidal cross member fused to a narrow stem and looks like and appears like the letter "T". As indicated above, the prior art was well aware of the advantages of such a T-gate and T-gate processing has been employed and described by a number of microwave groups over the past few years. For examples of such prior art, the following references are indicated.

See an article entitled "High Efficiency 35-GHz GaAs MESFETS" published in the *IEEE Transaction on Electron Devices.* Vol. ED-34 No. 6 June (1987) by G. C. Taylor, et al. This article describes the fabrication of Ti/Pt/Au gates in a shallow (80 nm) recess etched using gate photoresist as a mask into a 2.5 um long ledge channel. After gate metal deposition, the bottom Ti is chemically etched to a final gate length of 0.4 to 0.5 um. One disadvantage of this technique is that it cannot be used with commonly used Al/Ti gates without losing the top Ti layer. In addition the gate cannot be inspected easily after the Ti etch and ungated channel is guaranteed by the gate etch. Nevertheless the simplicity of the approach and the fact that a ledge is not always required may make the technique feasible if controlled undercut of the Ti layer can be achieved.

See also an article entitled "Electron Beam Fabrication of GaAs Low Noise MESFETs Using a New Trilayer Resist Technique" published in the IEEE Transaction on Electron Devices, Vol. ED-32 No. 6 June (1985) by P. C. Chao et al. This article describes a LO/HI/LO resist technique utilized to obtain MESFETs with an Ft greater than 100 GHz. The technique requires three resist coatings. A first coating employs a poly (methylmethacrylate) (PMMA). Then a copolymer of methylmethacrylate and methacrylic (MMA-MAA) is employed and finally a thin layer of PMMA is utilized. The total composite thickness is 1 um with a copolymer thickness of 0.5 um and no intermixing between PMMA and the copolymer.

The structures described are difficult to obtain given the involved resist chemistry. It is conceded in that paper that the bottom line width is difficult to control. In addition it would appear that even inspection of the patterns prior to recess etching or metalization would also be difficult because of the large aspect ratio between resist thickness and base opening. Thus it is felt that the technique described in that article will not result in an efficient production oriented technique.

See an article entitled "Submicron GaAs Microwave FET's With Low Parasitic Gate and Source Resistances" published in the IEEE Electron Device Letters, EDL-4 No. 2, February (1983) by S. G. Bandy et al. The technique described here is a straight forward trilayer composite of PMMA/200A Al/PMMA, utilizing only one 20 kV E-beam exposure. The top layer of PMMA is over developed, presumably without effecting the bottom layer, the Al barrier film is etched, and finally the bottom PMMA layer is developed to the required line width. A factor of 6 reduction in gate resistance was obtained leading to devices with a minimum NF of 1.0 db with 13 db of associated gain at 8 GHZ fabricated on n+-n MBE epi in a 0.5 um ledge channel. When utilizing this technique inspection would be difficult although base layer development should be straightforward and the technique should work with Ti/Al as well as Ti/Pt/Au gates. Major drawbacks of the technique are developing variations associated with the porous Al barrier, lack of dimensional control if the top resist chemistry is the same as the bottom, and potential alignment problems with the 200 A Al buried charged dissipation layer.

See a further article entitled "Submicron Lift Off Line With T-Shaped Cross Sectional Form, published in Electronics Letters, June 11, Volume 17, No. 12 (1981) by M. Matsumura et al. This article describes an E-beam, T-gate processing method in which a bi-layer resist composite is used. The top layer is high sensitivity PMIPK (Poly Methyl Isopropanol Ketone) and the bottom layer is a much lower sensitivity PMB. A proprietary developer was employed.

In reviewing the article one will ascertain that the technique described is extremely complicated depending critically on well established and reproduceable developing rates. This is one area which has been especially difficult to control in PMMA processing and would quite likely be more difficult to control with a composite resist layer using a single developer. In any event, the technique is not viable to be employed in modern day mass production techniques as they are extremely difficult to implement.

See an article entitled "Synchrotron Lithography for Sub-Half Micron T-Gates in GaAs FET" published in the Proceedings of Microcircuit Engineering (1986) by K. H. Mueller et al. This technique employed a trilayer PMMA composite consisting of three different molecular weights designed to yield a T-gate stencil after development and exposure to an X-ray dose of 2 to 3 Joules/$cm^2$. The main problem associated with this technique involved resist processing, in this case optimized for X-ray rather than E-beam lithography. The technique does not appear to be as advanced as the other techniques described in the prior art.

See an article entitled "Fabrication of 0.5 um Plated T-Gates for MESFETs Using the Suss MJB-3 Aligner", Suss Seminar Series, Publication 101 (1987) by R. W. Baird. This paper describes a very straight forward technique in which a base resist layer is contact printed at 300 nm followed by a recess etching and a sputter deposition of a plating seed (Ti/Pt/Au/Ti). A thicker top resist is then patterned by contact printing to form the top of the T followed by a Ti-etch and gold plating. This technique also proves difficult in that it is dependent on fine line plating techniques and therefore it is incompatible with Al/Ti gates. It is also incompatible with deep recess etching because of the requirement for plating seed continuity.

See also an article entitled "A GaAs Metal-Semiconductor Field-Effect Transistor With a Mushroom Gate Fabricated by Mixed Exposure of Focussed Ion Beams" published in the Journal of Vac. Sci. Technology, B, Vol. 5 No. 1 January/February 1987 by H. Morimoto et al. on pages 211-214. This article shows a focused ion beam lithography used for fabrication of high resolution patterns. Resist materials with a high resolution such as PMMA which are highly sensitive to ions while showing an extremely low sensitivity to UV light, electron or X-ray are employed. The ion beams are advantageous for high resolution lithography with dimensions less than 0.3 um. These characteristics of the ion beams are suitable for the fabrication of a gate pattern for high performance GaAs microwave FETs. The process flow for the fabrication of such devices is shown in FIG. 1 of article. As one can understand, the above techniques are extremely complicated and are difficult to employ.

It is therefore an object of the present invention to provide a T-gate for an FET which includes a deep (0.45 um) recess which increases the height of the stem.

It is a further object of the present invention to provide a T-gate for very high frequency power FETs where both short gate lengths and large cross sectional areas are desired.

It is a further object of the present invention to provide a method for fabricating a T-gate FET which method employs a thin layer of PMMA for the base of the T-gate and an optical Novolak resist to give a re-entrant side profile performed on top of the T.

It is a further object of the present invention to provide a method for forming a T-gate for an FET which method eliminates many of the disadvantages as described in conjunction with the above-noted prior art.

SUMMARY OF THE INVENTION

A method for fabricating a T-gate FET structure, comprising the steps of; applying a layer of PMMA to the top surface of a GaAs wafer, forming a gate pattern on said layer of PMMA, first developing said gate pattern as formed on said wafer for a given time interval, coating said developed wafer with a second layer of resist of a thicker dimension than said layer of PMMA and not reactive with said PMMA layer, forming said gate pattern on said second layer of resist, second developing said gate pattern on said second layer to form a composite T-gate configuration pattern, etching said wafer to form a T-gate recess in said wafer, and depositing a gate structure on said wafer to form a T-gate FET.

DETAILED DESCRIPTION OF THE FIGURES

Figure 1:
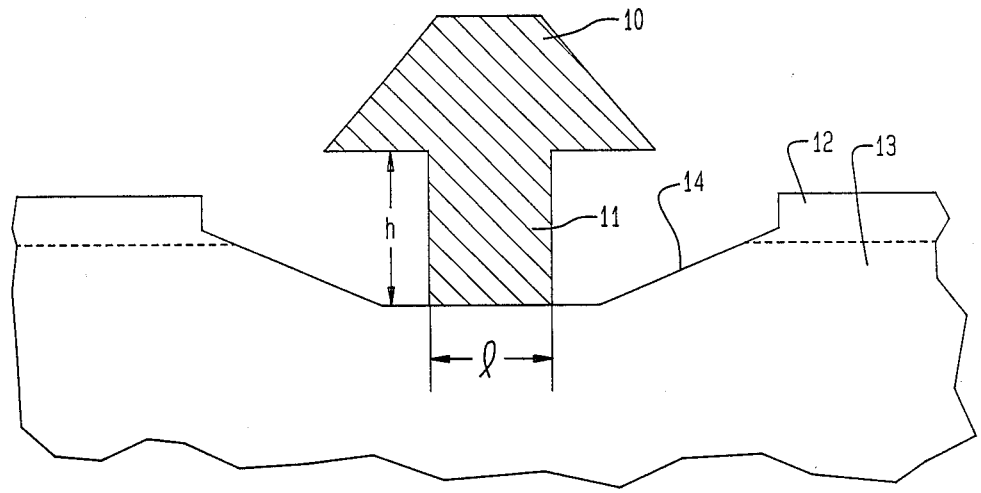
FIG. 1 is a cross sectional drawing of a T-gate in a deep etched recess in GaAs.
Figure 2E:
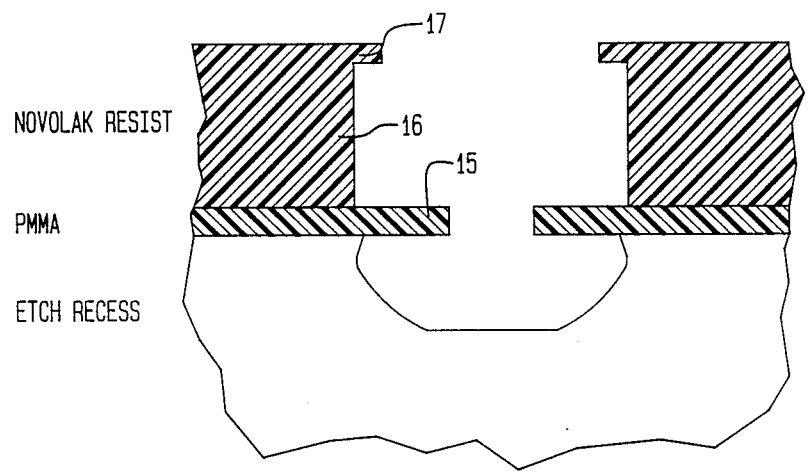
FIGS 2a-2e are cross sectional drawing illustrated a method of fabricating of a bi-level resist/gate recess according to this invention.
Figure 2A:
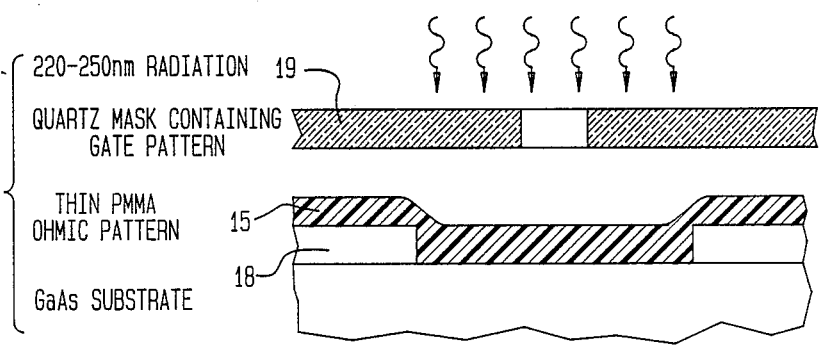
Figure 2B:
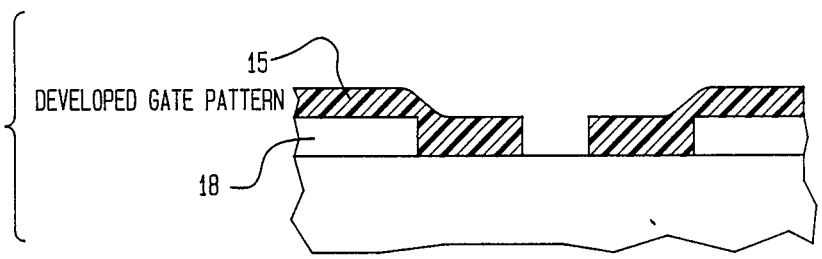
Figure 2C:
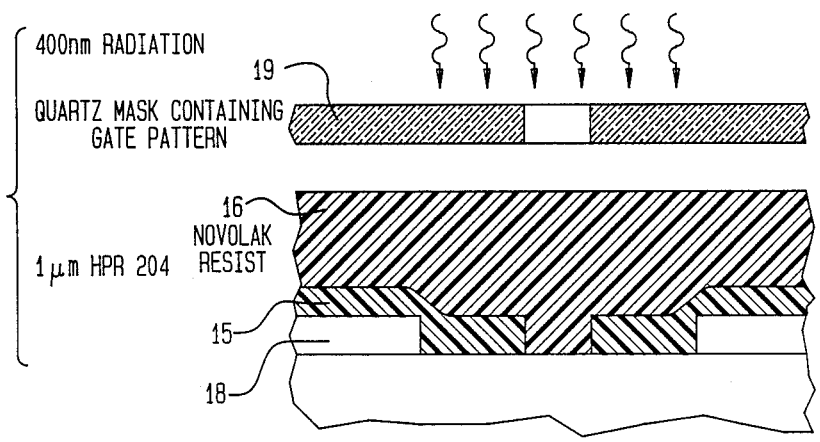
Figure 2D:
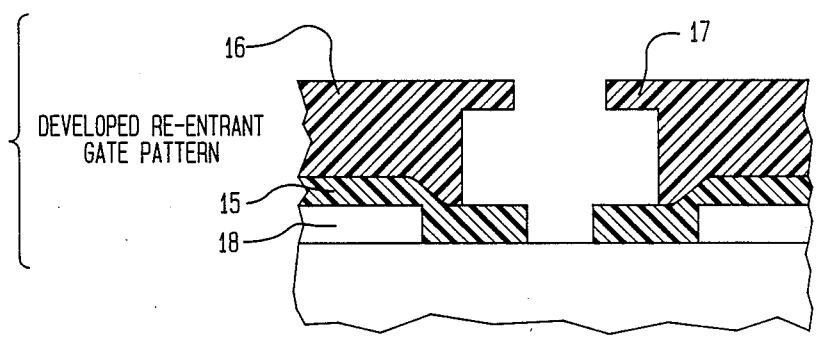

Referring to FIG. 1, there is shown a scaled drawing of a T-gate in a deep etch recessed channel. Such deep recesses are often required, for example, in power devices fabricated from GaAs epitaxial material comprising a heavily-doped contact layer 12 on top of a more lightly-doped active layer 13. As indicated above, the gate consists of a large trapozoidal cross-member 10 fused to a narrow stem 11 and looks like the letter "T". The structure to be described, and as shown in FIG. 1, differs from those in the published sources because it includes a deep (0.45 micron) recess 14 which increases the height (h) of the stem. Since the stem height must be greater than the etch depth, the integrity of the gate metalization may become difficult to control when (h) exceeds the gate length (l).

FIGS. 2a to 2e illustrate a method for fabrication a bi-level resist/gate recess according to this invention. As will be explained, the lithography used to produce the recess includes two layers of photoresist, a first thin layer 15 of PMMA (1500-3000 A) and a thicker Novolak resist 16. As indicated, the PMMA was applied first to the top surface of the GaAs wafer, spun to a thickness of 1500 A and baked at 250° C. for ten minutes. A gate pattern was aligned to the underlying Ohmic pattern 18 and exposed to 8000 mJ/cm$^2$ deep UV radiation (220-250 nm) through a quartz mask 19 containing 0.56 um gate features. See FIG. 2a. The wafer was then spray developed using a mixture of MIBK (methyl isobutyl ketone) and IPA (isopropyl alcohol). See FIG. 2b. The developed wafer was then coated with 1 um of a Novolak resist, HPR 204 as provided by Olin Hunt Company. The same gate mask 19 was then realigned to the Ohmic level and exposed to 600 mJ/cm$^2$ radiation in the 400 nm range. See FIG. 2c. A chlorobenzene soak followed and the wafer was spray developed again, this time using LSI developer. The chlorobenzene soak was used to generate a re-entrant profile or overhang 17 according to prior art in order to facilitate subsequent lift-off of the evaporated gate metal. Se FIG. 2c. The second photo was overexposed to form a large opening for the top of the T, while the first photo was underexposed to make the stem of the T as narrow as possible.

Figure 3:
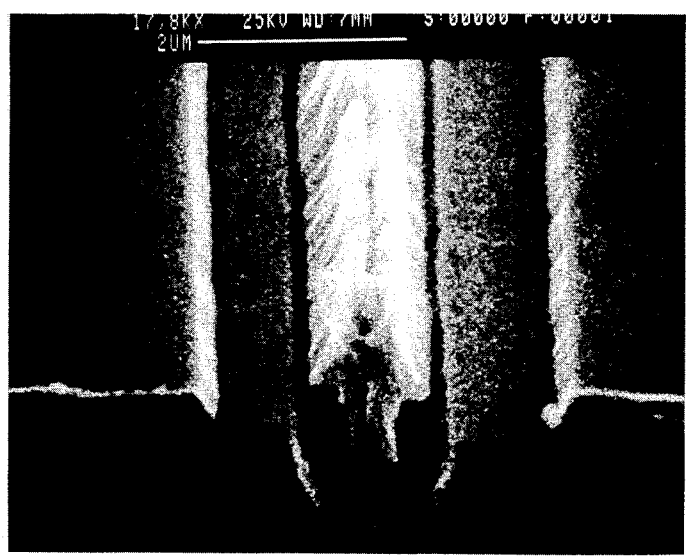
FIG. 3 is a photo micrograph showing a T-gate having a 0.5 um recess and constructed according to the techniques of this invention.

After an oxygen plasma descum, the wafer was spray etched with a sulfuric acid-hydrogen peroxide solution and rinsed with 10% ammonium hydroxide. See FIG. 2c. Aluminum, 7000-9000 A thick was then evaporated onto the entire wafer using electron beam evaporation. Subsequently, excess metal was removed or lifted off from the wafer by soaking it in an acetone bath subjected to ultrasonic agitation. A SEM cross section of the resultant T-gate following metal lift off is shown in FIG. 3.

Currently, deep UV contact printing is limited by masks; the smallest features obtainable on commercially available masks are now approximately 0.50 um. As indicated above, the same mask must be used twice, the second time in an overexposure mode. Overexposure causes line width and uniformity to suffer so that the size of the cross member becomes difficult to predict.

The second alignment must also match the first exactly, which is beyond the capability of contact printing. Present results enable one to obtain only a 40% yield due to misalignment if contact printing is used for both exposures.

Alternately, electron beam lithography has been substituted for deep UV contact printing, thereby greatly improving alignment accuracy and also allowing one to realize gate lengths of 0.25 micron. The E-beam exposure conditions are selected to reproduce the exact linewidths desired and also yield a re-entrant profile in the top layer of Novolak resist, thereby avoiding the need for a chlorobenzene a soak prior to development of this layer.

Figure 4:
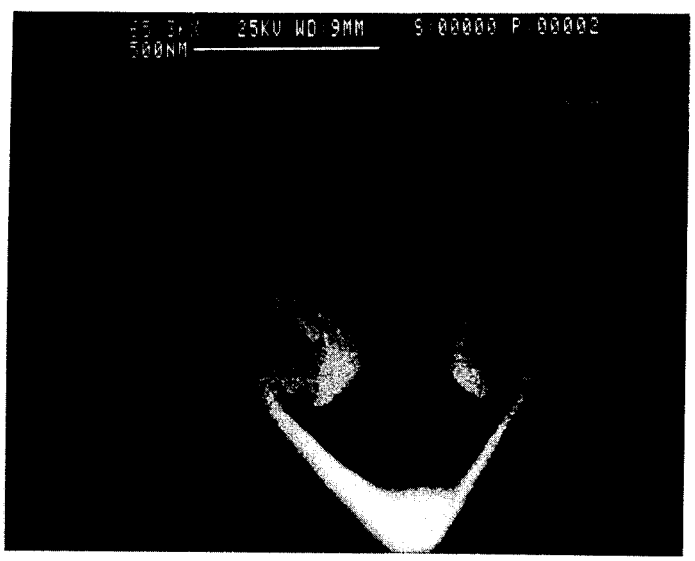
FIG. 4 is a photo micrograph of a cross section of an E-beam written resist lift off stencil after deep recess etching.

FIG. 4 shows an SEM cross-section of an etched gate recess with both resist layers in place and in which E-beam writing was used to yield a nominal 0.25 um gate opening in the base PMMA layer. In this case approximately 5000 A of AZ 5214E resist was used as the top resist and both resist layers were E-beam written using Ohmic metal markers for alignment. Excellent registration was obtained.

The height of the stem 11 is defined by the depth of the recess 14 plus the thickness of the PMMA layer 15. The metalization becomes more difficult when the stem of the T increases. Therefore, the PMMA layer should be as thin as possible. The PMMA layer is typically less than 3000 A thick. PMMA with a lower molecular weight and solids content can be employed to achieve such thin layers, but standard PMMA can be used which is diluted with chlorobenzene. The dilution can cause poor adhesion which can be observed in the etchings of certain samples if no adjustment in curing conditions is made to accommodate the lower solid contents of the base resist. In such cases, it was noted that reduced lateral etching was obtained in many samples which received twice the normal resist curing time.

As one can see from the above, the technique employs two resists to form the necessary structure. The thin layer 15 of PMMA is used for the base of the T-gate and an optical Novolak resist is processed to give a re-entrant side profile to form the top of the T. As one can ascertain, since both resists are processed separately and require independent alignment, exposure and development, this technique offer certain advantages.

Figure 5:
FIG. 5 is a photo micrograph of a T-gate terminating on an interconnection or pad that is fabricated without a T cross-member according to the techniques of this invention.

One advantage is that processing of each resist may be optimized for specific tasks. For example, the base PMMA layer may be thin since it is not used as a lift off parting layer. As a result, gate line width control should be optimum. Another factor is that the base resist thickness and adhesion can be optimized for subsequent recess etching and gate stem height requirements. The thin layer or base layer is more easily measured and inspected for complete development than a composite T-gate resist profile. The top resist layer can be processed to yield an arbitrarily sized T cross member without affecting the gate critical dimension and can also be patterned so that a T cross section is eliminated in the gate pad in order to avoid subsequent step coverage problems involving metal-to-metal interconnections. FIG. 5 shows an SEM micrograph of an Al/Ti T-gate processed according to this invention so that the crossmember 10 of the T is eliminated at the pad or interconnection section of the gate. It must be emphasized that this important advantage is not possible with single exposure and development techniques.

Another factor is that the thickness and sidewall profile of the top resist layer can be optimized for clean lift off of either Al, Al/Ti, Ti/Al, Ti/Al/Ti, Ti/Pt/Au or Ti/Pd/Au gates. In addition, as has been stated, both E-beam and optical lithography techniques can be employed depending on linewidth and throughput requirements as well as choice of materials.

As above indicated, since there are two levels of exposure, the lithograph technique makes the device more amenable to simplified production techniques and increased yields. The high resolution level is done first, and therefore, one has much better control. In addition, fine dimensions can be easily inspected. The second layer utilizes materials that do not interact with the bottom layer which bottom layer, as indicated above, is PMMA approximately 3,000 Angstroms thick which is optimally E-beam exposed and developed. Once one patterns the base layer 15 shown in FIG. 2b, one can then deposit a thin layer of aluminum which serves as a barrier layer between the PMMA and the Novolak resist to prevent any intermixing as well as also providing a current leakage path during E-beam writing of the Novolak resist in order to minimize drift. This layer is easily removed during the development of the top layer of resist in an alkaline developing medium.

For further information, the following examples were employed in order to fabricate the T-gate devices according to the above procedures:

A GaAs wafer was employed having an Ohmic pattern. A standard PMMA was utilized with dilution. The wafer was spin coated at 3,500 RPM with the diluted PMMA which PMMA was thinned utilizing 5 percent PMMA and chlorobenzene. The wafer was then baked for 10 minutes on a hot plate at 50° C. and then baked for an additional 10 minutes at 250° C. Final resist thickness was 1750–1850 A. The baked wafer was then aligned to the Ohmic level, exposed with deep UV at 8 mw/cm$^2$ using a K-band FET mask incorporating 0.55 um gates and spray developed with a (1:1) mixture of MIBK:IPA. The developed wafer was then coated at 6,000 RPM with Hunt 204 resist. This was soft baked for 4 minutes at 90° C. and then exposed for 45 seconds with mid-range UV at 10 mw/cm$^2$ using the same mask and alignment as above. The entire processed wafer was soaked in chlorobenzene for 8 minutes with mild agitation, and then developed for 1 minute in LSI developer diluted with 6 parts of water. The developed wafer was then descummed at 100 watts for 1.5 minutes in a barrel type plasma washer and etched for 5 minutes in a 1:8:640 mixture of $H_2SO_4:H_2O_2:H_2O$. Following a rinse in a 1:10 solution of $NH_4OH:H_2O$, aluminum was deposited to a thickness of 7000 A and lifted off in boiling acetone. The procedure resulted in a gate length of 0.4 um with an etched depth of 0.3 um. Stem height was 0.46 um and maximum width of the cross-member height was 0.98 um.

A second series of FET devices was prepared as the first except that the Hunt 204 Novolak resist was soft baked for 2 minutes at 110° C. This was then exposed for 1 minute with mid-range UV (405 nm at 10 mw/cm$^2$). The wafer was descummed in a single wafer plasma asher, etched to a depth of 0.40 um, rinsed with dilute $NH_4OH$ and deposited with aluminum. The aluminum deposition was accomplished in two steps: the first 5000 A was deposited at a rate of 1A/sec onto a stationary substrate while the final 4600 A was deposited at 5 A/sec onto a rotating substrate. This approach was intended to maintain a vertical metal profile for the stem of the T-gate and also to improve step coverage for the T-cross member. Resultant gates had a length of 0.5 um, maximum T-width of 1.14 um and were very smooth at the top. More importantly, gate resistance was a factor of four times smaller than that obtained with standard non T-gates with equivalent gate lengths. Thus, there has been described a double exposure, double develop technique for a T-gate process enabling one to manufacture low impedance metal gates on MESFET devices so that high frequency operation and low noise can be realized.

We claim:

1. A method for fabricating a T-gate FET structure, comprising the steps of:
    applying a layer of PMMA to the top surface of a GaAs wafer,
    forming a gate pattern on said layer of PMMA,
    first developing said gate pattern as formed on said wafer,
    coating said developed wafer with a second layer of resist of a thicker dimension than said layer of PMMA and not reactive with said PMMA layer,
    forming said gate pattern on said second layer of resist,
    second developing said gate pattern on said second layer to form a composite T-gate configuration pattern,
    etching said wafer to form a T-gate recess in said wafer, and
    depositing a gate structure on said wafer to form a T-gate FET.

2. The method according to claim 1, wherein the step of applying said first layer of PMMA comprises the steps of spinning said layer on said wafer to a thickness of about 1,500 A and baked at 250° for about 10 minutes.

3. The method according to claim 1, wherein the step of forming said gate pattern on said layer of PMMA comprises the steps of aligning said gate pattern to the Ohmic level and exposing said layer to UV radiation via a quartz mask.

4. The method according to claim 3, wherein said UV radiation is applied at 8,000 mJ/cm$^2$ at a wavelength between 220-250 nm.

5. The method according to claim 1, wherein the step of first developing said gate pattern comprises the steps of spray developing said wafer using a mixture of MIBK and isopropanol.

6. The method according to claim 1, wherein the step of forming a second layer of resist includes the steps of coating said developed layer with a Novolak resist.

7. The method according to claim 3, wherein the step of forming said same gate pattern includes the steps of aligning said quartz gate mask to the Ohmic level and exposing said wafer to UV radiation.

8. The method according to claim 7, wherein said UV radiation is applied at about 600 mJ/cm$^2$ in the 400 nm range.

9. The method according to claim 1, wherein the step of second developing said gate pattern includes the steps of soaking said wafer in a chlorobenzene soak and spray developing said wafer using an LSI developer.

10. The method according to claim 1, further including the step of descumming said developed wafer in an oxygen plasma environment.

11. The method according to claim 1, wherein the step of etching includes spray etching said wafer with a solution of sulfuric acid-hydrogen peroxide solution and then rinsing said wafer with a solution of ammonium hydroxide.

12. The method according to claim 1, wherein said T-gate has a stem of a height between 0.4 to 0.7 um, a top width of said T between 0.8-1.2 nm and a total height between 0.9 to 1.6 um.

13. The method according to claim 1, wherein said FET is a MESFET.

14. The method according to claim I, wherein said step of first developing includes underexposing said gate pattern to provide a narrow stem for said T.

15. The method according to claim 14, wherein the step of second developing includes overexposing said gate pattern to form a larger opening for the top of said T.

16. The method according to claim 1, wherein the step of depositing includes depositing a layer of aluminum (Al) over said recess to form said gate electrode.

17. The method according to claim 1, wherein the step of first developing comprises exposing said gate pattern to an electron beam using a photolithographic mask.

18. The method according to claim 1, wherein said PMMA is in solution with about 95% chlorobenzene.

19. The method according to claim 1, wherein the step of depositing includes depositing Ti/Pt/Au to form said gate electrode of said FET.

20. The method according to claim 6, wherein said second layer of Novolak is processed to provide a reentrant side profile to said recess.

* * * * *